(12) United States Patent
Huang et al.

(10) Patent No.: US 9,875,949 B2
(45) Date of Patent: Jan. 23, 2018

(54) ELECTRONIC PACKAGE HAVING CIRCUIT STRUCTURE WITH PLURALITY OF METAL LAYERS, AND FABRICATION METHOD THEREOF

(71) Applicant: Siliconware Precision Industries Co., Ltd., Taichung (TW)

(72) Inventors: Hsiao-Chun Huang, Taichung (TW); Hsien-Wen Chen, Taichung (TW); Shih-Ching Chen, Taichung (TW); Guang-Hwa Ma, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/981,521

(22) Filed: Dec. 28, 2015

(65) Prior Publication Data
US 2016/0329267 A1    Nov. 10, 2016

(30) Foreign Application Priority Data

May 4, 2015   (TW) .............................. 104114112 A

(51) Int. Cl.
*H01L 23/12*   (2006.01)
*H01L 21/00*   (2006.01)
(Continued)

(52) U.S. Cl.
CPC ........ *H01L 23/3121* (2013.01); *H01L 23/481* (2013.01); *H01L 23/49811* (2013.01);
(Continued)

(58) Field of Classification Search
CPC ....... H01L 24/19; H01L 24/13; H01L 23/481; H01L 23/49816; H01L 23/49822;
(Continued)

(56) References Cited

U.S. PATENT DOCUMENTS 5,877,076 A * 3/1999 Dai ..................... H01L 21/0274
                                                    257/E21.027
6,452,270 B1 * 9/2002 Huang .................... H01L 24/11
                                                            257/737
(Continued)

*Primary Examiner* — Alonzo Chambliss
(74) *Attorney, Agent, or Firm* — Mintz Levin Cohn Ferris Glovsky and Popeo, P.C.; Peter F. Corless; Steven M. Jensen

(57) ABSTRACT

An electronic package is provided, which includes: a circuit structure having opposite first and second sides; at least an electronic element disposed on the first side of the circuit structure; an encapsulant formed on the first side of the circuit structure for encapsulating the electronic element; a dielectric layer formed on portions of the second side of the circuit structure; and a metal structure formed on the dielectric layer and the circuit structure. The metal structure has a first metal layer bonded to the circuit structure and a second metal layer formed on the first metal layer and the dielectric layer. Therefore, by replacing a conventional silicon interposer with the circuit structure, the invention eliminates the need to fabricate through silicon vias so as to greatly reduce the fabrication difficulty and cost. The invention further provides a method for fabricating the electronic package.

24 Claims, 6 Drawing Sheets

(51) Int. Cl.
  *H01L 23/31* (2006.01)
  *H01L 23/48* (2006.01)
  *H01L 23/498* (2006.01)
  *H01L 23/538* (2006.01)
  *H01L 25/065* (2006.01)
  *H01L 25/00* (2006.01)

(52) U.S. Cl.
  CPC ...... *H01L 23/5383* (2013.01); *H01L 23/5384* (2013.01); *H01L 23/5385* (2013.01); *H01L 25/0655* (2013.01); *H01L 25/50* (2013.01); *H01L 2224/16238* (2013.01); *H01L 2224/32225* (2013.01); *H01L 2224/73204* (2013.01); *H01L 2224/81005* (2013.01); *H01L 2224/83005* (2013.01); *H01L 2924/15311* (2013.01); *H01L 2924/15313* (2013.01); *H01L 2924/18161* (2013.01); *H01L 2924/19041* (2013.01); *H01L 2924/19042* (2013.01); *H01L 2924/19043* (2013.01); *H01L 2924/19105* (2013.01)

(58) Field of Classification Search
  CPC ............... H01L 23/5384; H01L 21/486; H01L 23/5383; H01L 23/3121; H01L 23/49811; H01L 23/5385; H01L 25/0657; H01L 25/50
  See application file for complete search history.

(56) References Cited

U.S. PATENT DOCUMENTS

| | | | | |
|---|---|---|---|---|
| 7,759,786 | B2* | 7/2010 | Kurita | H01L 21/563 257/700 |
| 7,993,972 | B2* | 8/2011 | Lin | H01L 21/6835 216/14 |
| 9,299,688 | B2* | 3/2016 | Yu | H01L 25/105 |
| 2004/0140551 | A1* | 7/2004 | Usui | H01L 21/6835 257/700 |
| 2007/0080444 | A1* | 4/2007 | Kurita | H01L 21/563 257/700 |
| 2008/0284017 | A1* | 11/2008 | Lee | H01L 21/6835 257/738 |
| 2009/0140442 | A1* | 6/2009 | Lin | H01L 21/565 257/778 |
| 2010/0140759 | A1* | 6/2010 | Pagaila | H01L 21/565 257/660 |
| 2011/0254155 | A1* | 10/2011 | Lin | H01L 21/6835 257/737 |
| 2014/0339699 | A1* | 11/2014 | Arvin | H01L 23/49816 257/738 |
| 2015/0380334 | A1* | 12/2015 | Hu | H01L 23/36 257/712 |
| 2016/0013148 | A1* | 1/2016 | Lin | H01L 23/552 257/773 |

* cited by examiner

US 9,875,949 B2

ELECTRONIC PACKAGE HAVING CIRCUIT STRUCTURE WITH PLURALITY OF METAL LAYERS, AND FABRICATION METHOD THEREOF

CROSS-REFERENCES TO RELATED APPLICATIONS

This application claims under 35 U.S.C. §119(a) the benefit of Taiwanese Application No. 104114112, filed May 4, 2015, the entire contents of which are incorporated herein by reference.

BACKGROUND OF THE INVENTION

1. Field of the Invention

The present invention relates to packaging processes, and more particularly, to an electronic package and a fabrication method thereof for saving the fabrication cost.

2. Description of Related Art

Along with the rapid development of electronic industries, electronic products are developed toward the trend of multi-function and high performance. Accordingly, there have been developed various types of flip-chip packaging modules such as chip scale packages (CSPs), direct chip attached (DCA) packages and multi-chip modules (MCM), and 3D IC chip stacking technologies.

FIGS. 1A to 1F are schematic cross-sectional views showing a method for fabricating a 3D chip stacking-type electronic package 1 according to the prior art.

Referring to FIG. 1A, a silicon substrate 10 having a chip mounting side 10a and an opposite external connection side 10b is provided, and a plurality of via holes 100 are formed on the chip mounting side 10a of the silicon substrate 10.

Referring to FIG. 1B, an insulating material 102 and a conductive material such as copper are filled in the via holes 100 to form a plurality of through silicon vias (TSVs) 101. Then an RDL (Redistribution Layer) structure is formed on the chip mounting side 10a of the silicon substrate 10 and electrically connected to the TSVs 101.

In particular, to form the RDL structure, a dielectric layer 11 is first formed on the chip mounting side 10a of the silicon substrate 10. Then, a circuit layer 12 is formed on the dielectric layer 11 and has a plurality of conductive vias 120 formed in the dielectric layer 11 and electrically connected to the TSVs 101. Thereafter, a solder mask layer 13 is formed on the dielectric layer 11 and the circuit layer 12, exposing portions of the circuit layer 12.

Further, a plurality of solder bumps 14 can be formed on the exposed portions of the circuit layer 12.

Referring to FIG. 1C, mechanical grinding and CMP (chemical mechanical polishing) processes are performed on the external connection side 10b of the silicon substrate 10 to remove a portion of the silicon substrate 10, thereby forming an external connection side 10b' exposing one end surfaces of the TSVs 101.

Referring to FIG. 1D, another solder mask layer 15 is formed on the external connection side 10b' of the silicon substrate 10, exposing the end surfaces of the TSVs 101. Then, a plurality of conductive elements 16 are formed on the end surfaces of the TSVs 101 so as to be electrically connected to the TSVs 101. The conductive elements 16 can include a solder material or can be copper bumps. Further, the conductive elements 16 can selectively include a UBM (Under Bump Metallurgy) layer 160.

Referring to FIG. 1E, a singulation process is performed along cutting paths S of FIG. 1D to obtain a plurality of silicon interposers 1a. Then, such a silicon interposer 1a is disposed on a packaging substrate 19 through the conductive elements 16. In particular, the packaging substrate 19 has a plurality of conductive pads 190 electrically connected to the TSVs 101 through the conductive elements 16, and the conductive pads 190 have a large pitch therebetween. Subsequently, an underfill 191 is formed between the silicon interposer 1a and the packaging substrate 19 to encapsulate the conductive elements 16.

Referring to FIG. 1F, a plurality of semiconductor chips 17 are disposed on the solder bumps 14 so as to be electrically connected to the circuit layer 12. In particular, the semiconductor chips 17 are flip-chip bonded to the solder bumps 14, and an underfill 171 is formed between the semiconductor chips 17 and the silicon interposer 1a to encapsulate the solder bumps 14. The electronic elements 17 have a plurality of electrode pads having a small pitch therebetween.

Then, an encapsulant 18 is formed on the packaging substrate 19 to encapsulate the semiconductor chips 17 and the silicon interposer 1a.

Finally, a plurality of solder balls 192 are formed on a lower side of the packaging substrate 19 for mounting an electronic device, for example, a circuit board (not shown). As such, an electronic package 1 is obtained.

In the electronic package 1, the silicon interposer 1a serves as a signal transmission medium between the semiconductor chips 17 and the packaging substrate 19. To achieve a suitable silicon interposer 1a, the TSVs 101 must be controlled to have a certain depth to width ratio (100 um/10 um), thus consuming a large amount of time and chemical agent and incurring a high fabrication cost.

Further, during the CMP process, copper ions of the TSVs 101 can diffuse into the silicon substrate 10 and cause bridging or leakage problems between the TSVs 101.

Furthermore, the silicon interposer 1a leads to an increase in thickness of the electronic package 1 and hinders thinning of the electronic package 1.

Therefore, how to overcome the above-described drawbacks has become critical.

SUMMARY OF THE INVENTION

In view of the above-described drawbacks, the present invention provides an electronic package, which comprises: a circuit structure having a first side and a second side opposite to the first side; at least an electronic element disposed on the first side of the circuit structure; an encapsulant formed on the first side of the circuit structure for encapsulating the electronic element; a dielectric layer formed on the second side of the circuit structure and exposing portions of the second side of the circuit structure; and a metal structure formed on the dielectric layer and the exposed portions of the second side of the circuit structure, wherein the metal structure comprises a first metal layer bonded to the circuit structure and a second metal layer formed on the first metal layer and the dielectric layer.

The present invention further provides a method for fabricating an electronic package, which comprises the steps of: providing a circuit structure having a first side and a second side opposite to the first side; disposing at least an electronic element on the first side of the circuit structure; forming an encapsulant on the first side of the circuit structure for encapsulating the electronic element; forming a dielectric layer on the second side of the circuit structure, wherein portions of the second side of the circuit structure are exposed from the dielectric layer; and forming a metal structure on the dielectric layer and the exposed portions of the second side of the circuit structure, wherein the metal structure comprises a first metal layer bonded to the circuit structure and a second metal layer formed on the first metal layer and the dielectric layer.

In the above-described method, the dielectric layer can have a plurality of openings exposing portions of the circuit structure, and forming the metal structure can comprise forming the first metal layer by sputtering on bottom surfaces of the openings and then forming the second metal layer by sputtering on the first metal layer, side walls of the openings and the dielectric layer.

In the above-described package and method, the circuit structure can comprise a plurality of insulating layers and a plurality of circuit layers stacked on one another, wherein the electronic element is electrically connected to the circuit layers. For example, the circuit structure is a dual damascene structure formed in a single process.

In the above-described package and method, the second side of the circuit structure can have a plurality of conductive pads exposed from the dielectric layer and bonded with the first metal layer of the metal structure.

In the above-described package and method, a portion of the surface of the electronic element can be exposed from the encapsulant.

In the above-described package and method, the dielectric layer can be made of PBO (polybenzoxazole) or a photoresist material.

In the above-described package and method, the first metal layer can be a titanium layer, and the second metal layer can be a copper layer.

In the above-described package and method, a substrate can be disposed on the encapsulant.

In the above-described package and method, at least a conductive through hole can be formed in the encapsulant and electrically connected to the circuit structure. Further, a substrate can be disposed on the encapsulant and electrically connected to the conductive through hole.

In the above-described package and method, a plurality of conductive elements can be formed on the metal structure.

According to the present invention, the circuit structure is provided to replace a conventional silicon interposer and serve as a signal transmission medium between the electronic element and a packaging substrate. As such, the present invention eliminates the need to fabricate TSVs (Through Silicon Vias) as required in the prior art, thereby greatly reducing the fabrication difficulty and cost and overcoming the conventional problems such as bridging or leakage problems between TSVs.

Further, by dispensing with the silicon interposer, the present invention reduces the thickness of the overall package and hence meets the thinning requirement.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2G are schematic cross-sectional views showing a method for fabricating an electronic package 2 according to the present invention.

Figure 1A:
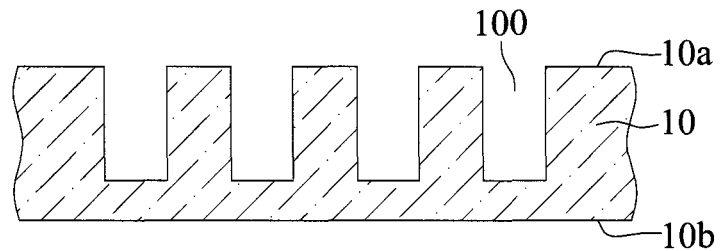
FIGS. 1A to 1F are schematic cross-sectional views showing a method for fabricating an electronic package according to the prior art.
Figure 1B:
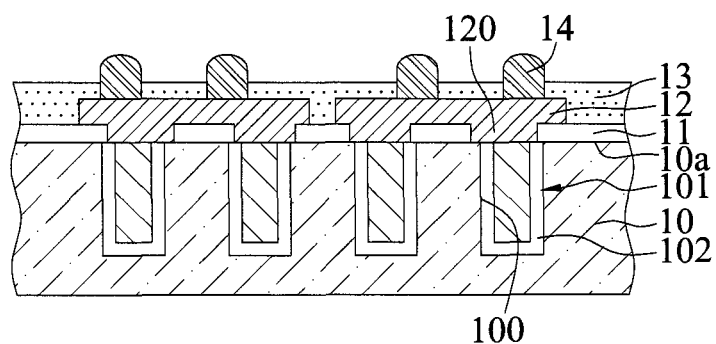
Figure 1C:
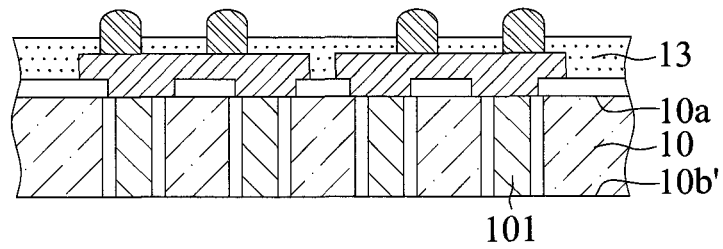
Figure 1D:
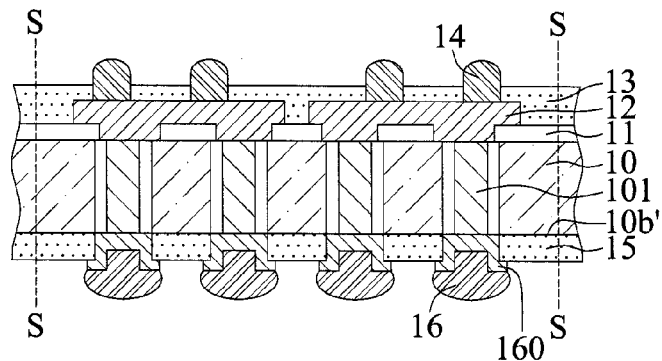
Figure 1E:
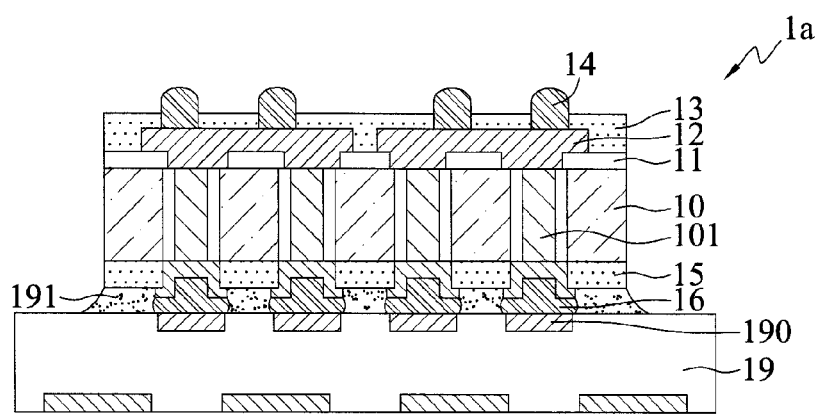
Figure 1F:
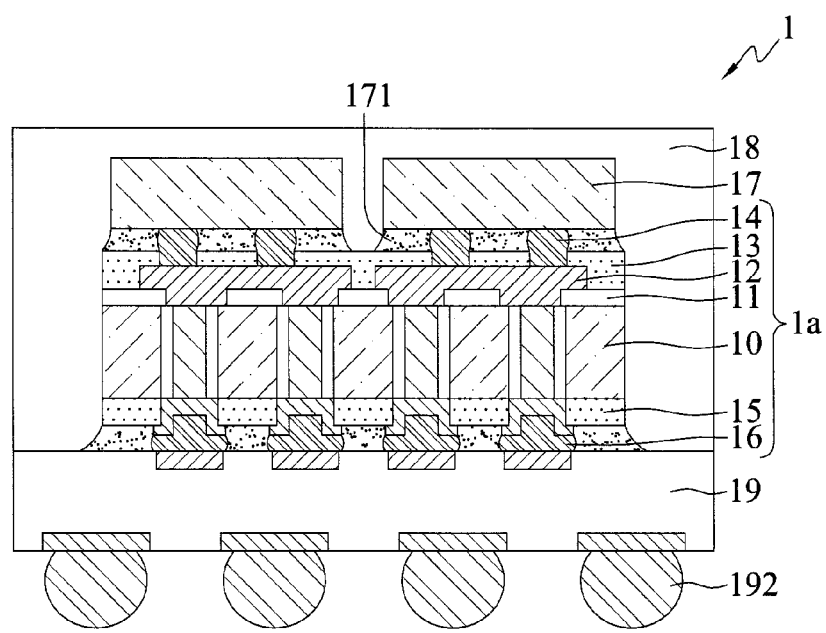
Figure 2A:
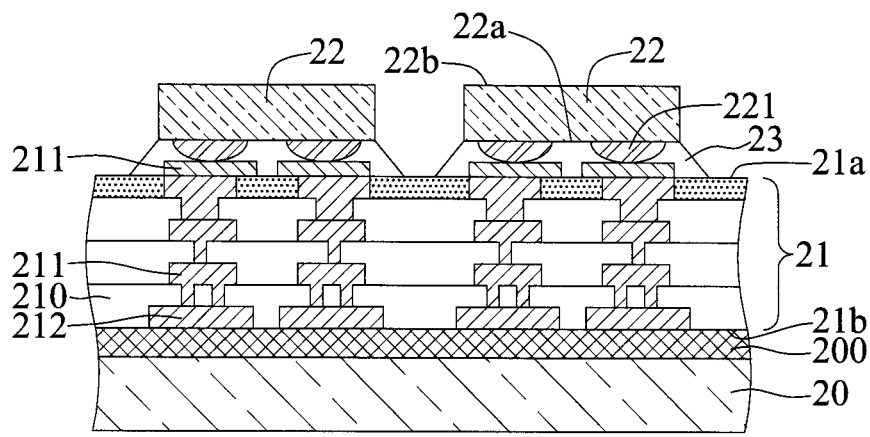
FIGS. 2A to 2G are schematic cross-sectional views showing a method for fabricating an electronic package according to the present invention, wherein FIGS. 2F' is a partially enlarged view of FIG. 2F.

Referring to FIG. 2A, a carrier 20 having a circuit structure 21 is provided. A plurality of electronic elements 22 are disposed on the circuit structure 21, and an underfill 23 is formed between the circuit structure 21 and the electronic elements 22.

In the present embodiment, the carrier 20 is made of glass, an organic polymer or a semiconductor material such as silicon.

Each of the electronic elements 22 is an active element such as a semiconductor chip, a passive element such as a resistor, a capacitor or an inductor, or a combination thereof. In the present embodiment, the electronic element 22 is an active element having an active surface 22a and an inactive surface 22b opposite to the active surface 22a.

The circuit structure 21 has a plurality of insulating layers 210 and a plurality of circuit layers 211 stacked on one another. The circuit structure 21 has a first side 21a and a second side 21b opposite to the first side 21a. The active surfaces 22a of the electronic elements 22 are bonded to the circuit layer 211 of the first side 21a of the circuit structure 21 through a plurality of conductive bumps 221, and the underfill 23 encapsulates the conductive bumps 221. The second side 21b of the circuit structure 21 has a plurality of conductive pads 212 bonded to the carrier 20.

The circuit structure 21 can be a dual damascene structure formed in a single process. In particular, an oxide layer and a nitride layer are formed to serve as an insulating layer 210 and then a plurality of via holes are formed in the oxide layer and the nitride layer by etching. Thereafter, a titanium layer or a copper layer is formed by chemical deposition, sputtering or electroplating to serve as a conductive layer. Subsequently, a circuit layer 211 is formed through a copper electroplating process. Finally, excess portions of the conductive layer are removed.

Further, a release layer 200 can be formed between the carrier 20 and the second side 21b of the circuit structure 21. For example, the release layer 200 can be removed by heating. Alternatively, if the carrier 20 is a glass board or made of a transparent material, the release layer 200 can be removed by laser irradiation.

Figure 2B:
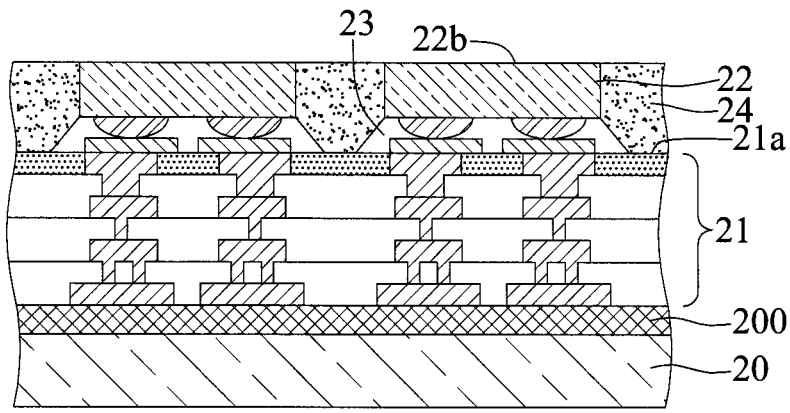

Referring to FIG. 2B, by performing a molding process, an encapsulant 24 is formed on the first side 21a of the circuit structure 21 for encapsulating the electronic elements 22 and the underfill 23.

In the present embodiment, an upper portion of the encapsulant 24 is removed and thus the inactive surfaces 22b of the electronic elements 22 are exposed from the encapsulant 24 for heat dissipation.

Figure 2C:
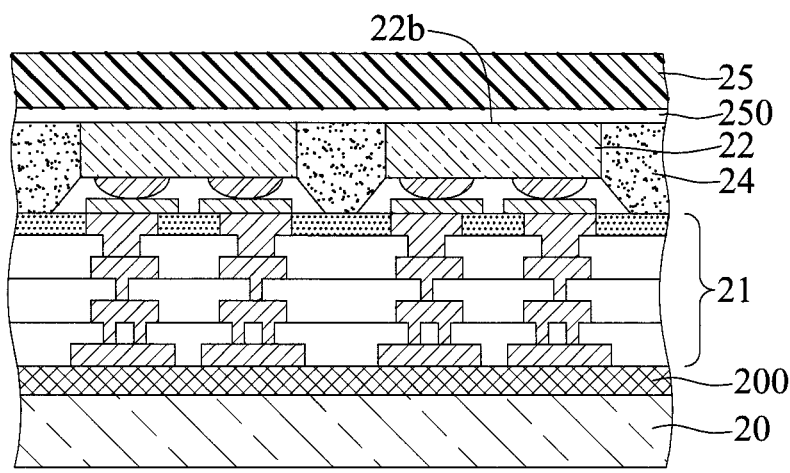

Referring to FIG. 2C, a substrate 25 is disposed on the encapsulant 24 and the inactive surfaces 22b of the electronic elements 22.

In the present embodiment, the substrate 25 is made of glass, metal, an organic polymer, or a semiconductor material such as silicon.

A release layer 250 can be formed between the substrate 25 and the encapsulant 24. For example, the release layer 250 can be removed by heating. Alternatively, if the substrate 25 is a glass board or made of a transparent material, the release layer 250 can be removed by laser irradiation.

Figure 2D:
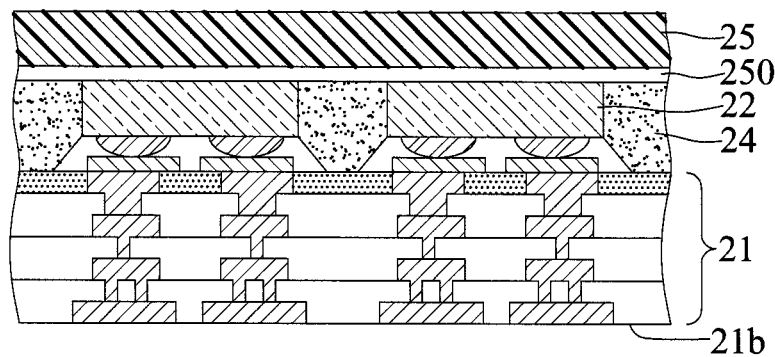

Referring to FIG. 2D, the carrier 20 is removed to expose the second side 21b of the circuit structure 21.

Figure 2E:
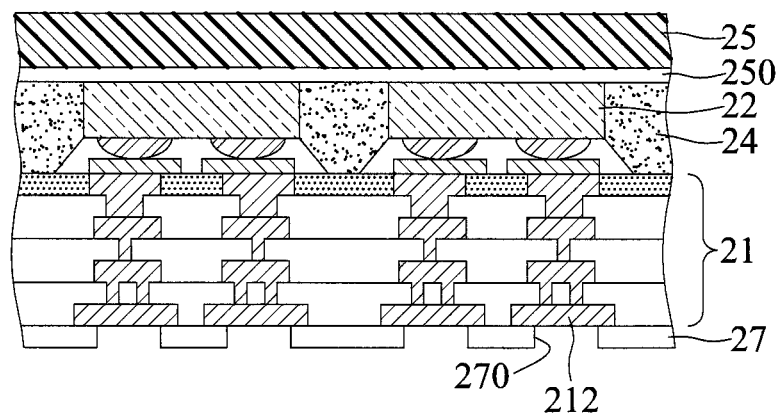

Referring to FIG. 2E, a dielectric layer 27 is formed on the second side 21b of the circuit structure 21 and has a plurality of openings 270 exposing the conductive pads 212 of the circuit structure 21.

In the present embodiment, the dielectric layer 27 is made of PBO (polybenzoxazole) or a photoresist material.

Figure 2F:
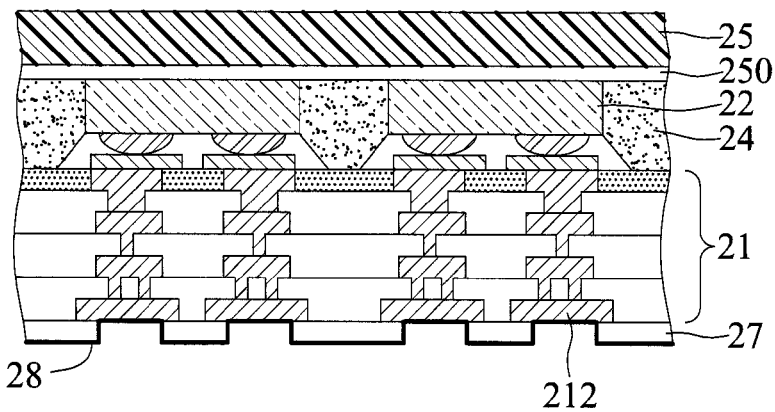
Figure 2F:
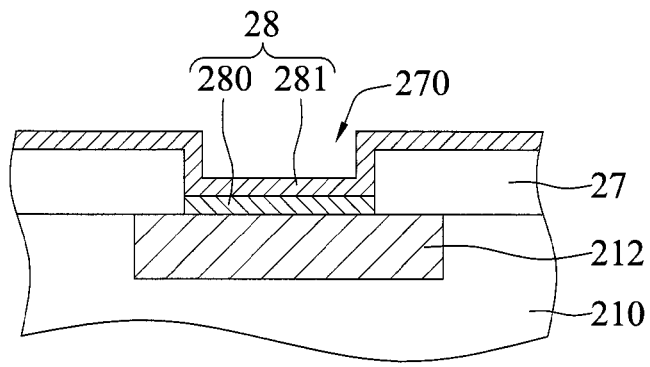

Referring to FIG. 2F, a metal structure 28 is formed on the dielectric layer 27 and the conductive pads 212 of the circuit structure 21.

In the present embodiment, referring to FIG. 2F', the metal structure 28 has a first metal layer 280 and a second metal layer 281. In particular, the first metal layer 280 is a titanium layer, which is formed on the conductive pads 212 and serves as a metal adhesive layer, and the second metal layer 281 is a copper layer, which is formed on the first metal layer 280 and the dielectric layer 27 and serves as a conductive layer for electroplating.

For example, the titanium layer, i.e., the first metal layer 280, is formed by sputtering on bottom surfaces of the openings 270 first, and then the copper layer, i.e., the second metal layer 281, is formed by sputtering on the titanium layer, side walls of the openings 270 and the dielectric layer 27.

Figure 2G:
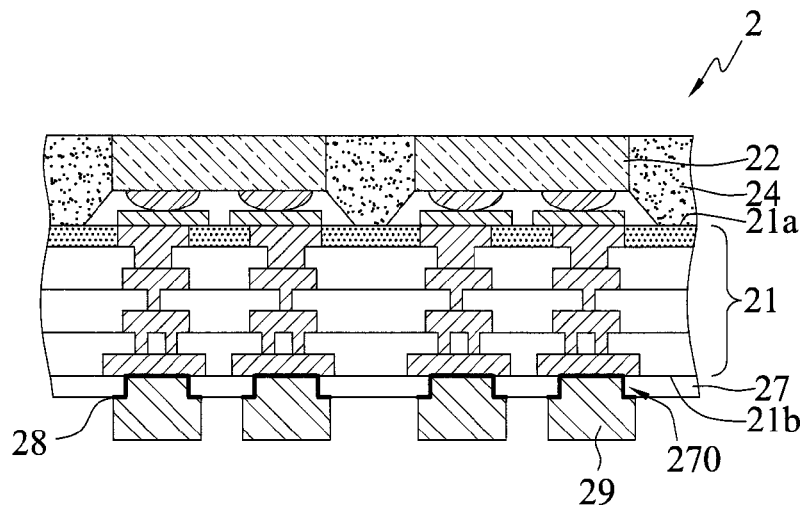

Referring to FIG. 2G, a plurality of conductive elements 29 made of such as a solder material are formed on the metal structure 28 in the openings 270 (i.e., the second metal layer 281), and then portions of the metal structure 28 that are not covered by the conductive elements 29 (i.e., the second metal layer 281 on the dielectric layer 27) are removed by etching. As such, the remaining portions of the metal structure 28 serve as a UBM (Under Bump Metallurgy) layer. Thereafter, the substrate 25 and the release layer 250 are removed.

In the present embodiment, the conductive elements 29 are formed by electroplating or printing and electrically connected to the conductive pads 212.

Subsequently, a singulation process can be performed to obtain a plurality of electronic packages 2. Such an electronic package 2 can be disposed on an electronic device (not shown) such as a circuit board through the conductive elements 29.

According to the present invention, the circuit structure 21 is used to replace the conventional silicon interposer and serve as a signal transmission medium between the electronic elements 22 and a packaging substrate (not shown). As such, the present invention eliminates the need to fabricate TSVs as required in the prior art, thereby greatly reducing the fabrication difficulty and cost and overcoming the conventional problems such as bridging or leakage problems between the TSVs.

Further, by dispensing with the silicon interposer, the present invention reduces the thickness of the overall package and hence meets the thinning requirement.

Figure 3A:
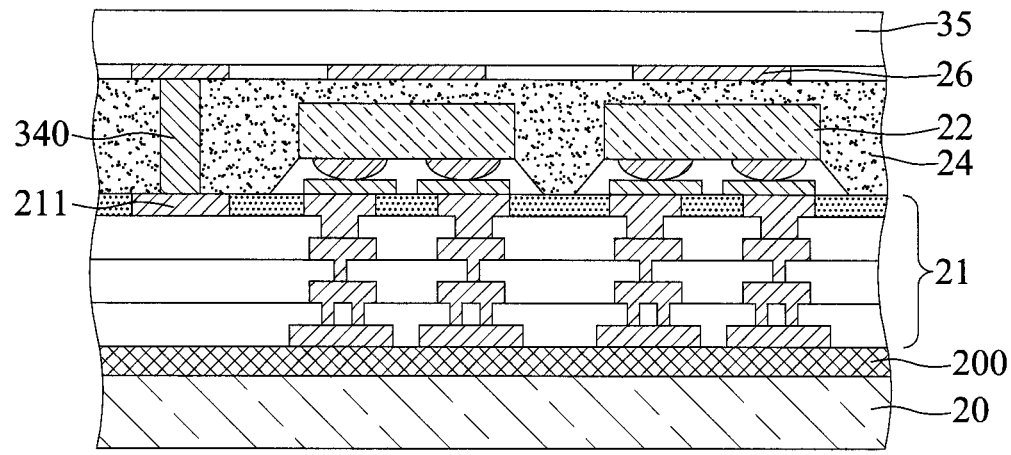
FIGS. 3A and 3B are schematic cross-sectional views showing a method for fabricating an electronic package according to another embodiment of the present invention.
Figure 3B:
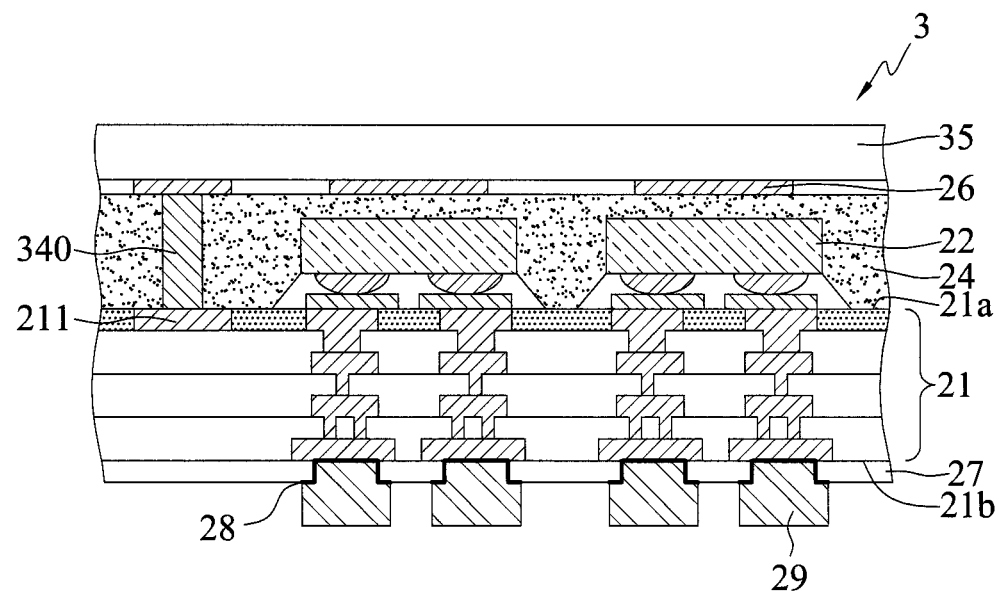

FIGS. 3A and 3B are schematic cross-sectional views showing a method for fabricating an electronic package 3 according to another embodiment of the present invention.

Referring to FIG. 3A, continued from FIG. 2B, at least a conductive through hole 340 is formed in the encapsulant 24 and electrically connected to the circuit layer 211 of the circuit structure 21, and a wiring layer 26 is formed on the encapsulant 24 and electrically connected to the conductive through hole 340. Thereafter, a substrate 35 is disposed on the encapsulant 24. The substrate 35 is a circuit board, which is electrically connected to the conductive through hole 240 and the wiring layer 26. As such, an electronic device such as a package structure, an interposer or a chip (not shown) can be stacked on the substrate 35.

Referring to FIG. 3B, the processes of FIGS. 2D to 2G are performed. But the substrate 35 does not need to be removed. As such, after a singulation process, a plurality of electronic packages 3 are obtained.

According to the present embodiment, the conductive through hole 340 is formed to electrically connect the substrate 35 and the circuit layer 211 of the circuit structure 21, thereby allowing other electronic devices to be stacked on the substrate 35.

The present invention further provides an electronic package 2, 3, which has: a circuit structure 21 having a first side 21a and a second side 21b opposite to the first side 21a; at least an electronic element 22 disposed on the first side 21a of the circuit structure 21; an encapsulant 24 formed on the first side 21a of the circuit structure 21 for encapsulating the electronic element 22; a dielectric layer 27 formed on the second side 21b of the circuit structure 21 and exposing portions of the second side 21b of the circuit structure 21; and a metal structure 28 formed on the dielectric layer 27 and the exposed portions of the second side 21b of the circuit structure 21. Further, the metal structure 28 has a first metal layer 280 formed on the conductive pads 212 of the second side 21b of the circuit structure 21 and a second metal layer 281 formed on the first metal layer 280 and the dielectric layer 27.

The circuit structure 21 can have a plurality of insulating layers 210 and a plurality of circuit layers 211 stacked on one another, and the electronic element 22 is electrically connected to the circuit layers 211. The second side 21b of the circuit structure 21 can have a plurality of conductive pads 212.

The electronic element 22 can have an active surface 22a and an inactive surface 22b opposite to the active surface 22a.

The dielectric layer 27 can be made of PBO or a photoresist material, and the conductive pads 212 can be exposed from the dielectric layer 27.

In an embodiment, the inactive surface 22b of the electronic element 22 is exposed from the encapsulant 24.

In an embodiment, the first metal layer 280 is a titanium layer.

In an embodiment, the second metal layer 281 is a copper layer.

In an embodiment, the electronic package 2, 3 further has a plurality of conductive elements 29 formed on the metal structure 28.

In an embodiment, the electronic package 2, 3 further has a substrate 25, 35 disposed on the encapsulant 24.

In an embodiment, the electronic package 3 further has at least a conductive through hole 340 formed in the encapsulant 24 and electrically connected to the circuit structure 21.

Furthermore, a substrate 35 can be disposed on the encapsulant 24 and electrically connected to the conductive through hole 340.

Therefore, by replacing the conventional silicon interposer with the circuit structure, the present invention eliminates the need to fabricate TSVs as required in the prior art, thus greatly reducing the fabrication difficulty and cost and overcoming the conventional problems such as bridging or leakage problems between TSVs.

Further, by dispensing with the silicon interposer, the present invention reduces the thickness of the overall package and hence meets the thinning requirement.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electronic package, comprising:
    a circuit structure having a first side and a second side opposite to the first side;
    at least an electronic element disposed on the first side of the circuit structure;
    an encapsulant formed on the first side of the circuit structure for encapsulating the electronic element;
    a dielectric layer formed on the second side of the circuit structure and having a plurality of openings exposing portions of the second side of the circuit structure, wherein the circuit structure is free from being formed in the openings; and
    a metal structure formed on the dielectric layer and the exposed portions of the second side of the circuit structure, wherein the metal structure comprises a first metal layer bonded to the circuit structure in the openings and a second metal layer formed on the first metal layer, side walls of the openings and the dielectric layer, and wherein the first metal layer and the second metal layer are in direct contact with the side walls of the openings.

2. The package of claim 1, wherein the circuit structure comprises a plurality of insulating layers and a plurality of circuit layers stacked on one another, the electronic element being electrically connected to the circuit layers.

3. The package of claim 1, wherein the second side of the circuit structure has a plurality of conductive pads exposed from the dielectric layer and bonded with the first metal layer of the metal structure.

4. The package of claim 1, wherein a portion of the surface of the electronic element is exposed from the encapsulant.

5. The package of claim 1, wherein the dielectric layer is made of PBO (polybenzoxazole) or a photoresist material.

6. The package of claim 1, wherein the first metal layer is a titanium layer.

7. The package of claim 1, wherein the second metal layer is a copper layer.

8. The package of claim 1, further comprising at least a conductive through hole formed in the encapsulant and electrically connected to the circuit structure.

9. The package of claim 8, further comprising a substrate disposed on the encapsulant and electrically connected to the conductive through hole.

10. The package of claim 9, further comprising a release layer formed between the substrate and the encapsulant and in direct contact with the encapsulant.

11. The package of claim 1, further comprising a plurality of conductive elements formed on the metal structure.

12. A method for fabricating an electronic package, comprising the steps of:
    providing a circuit structure having a first side and a second side opposite to the first side;
    disposing at least an electronic element on the first side of the circuit structure;
    forming an encapsulant on the first side of the circuit structure for encapsulating the electronic element;
    forming a dielectric layer on the second side of the circuit structure after forming the encapsulant on the first side of the circuit structure, wherein portions of the second side of the circuit structure are exposed from the dielectric layer; and
    forming a metal structure on the dielectric layer and the exposed portions of the second side of the circuit structure after forming the dielectric layer on the second side of the circuit structure, wherein the metal structure comprises a first metal layer bonded to the circuit structure in the openings and a second metal layer formed on the first metal layer, side walls of the openings and the dielectric layer, and wherein the first metal layer and the second metal layer are in direct contact with the side walls of the openings.

13. The method of claim 12, wherein the circuit structure comprises a plurality of insulating layers and a plurality of circuit layers stacked on one another, the electronic element being electrically connected to the circuit layers.

14. The method of claim 13, wherein the circuit structure is a dual damascene structure formed in a single process.

15. The method of claim 12, wherein the second side of the circuit structure has a plurality of conductive pads exposed from the dielectric layer, allowing the first metal layer to be formed on the conductive pads.

16. The method of claim 12, wherein a portion of the surface of the electronic element is exposed from the encapsulant.

17. The method of claim 12, wherein the dielectric layer is made of PBO or a photoresist material.

18. The method of claim 12, wherein the first metal layer is a titanium layer.

19. The method of claim 12, wherein the second metal layer is a copper layer.

20. The method of claim 12, wherein the dielectric layer has a plurality of openings exposing portions of the circuit structure, and forming the metal structure comprises forming the first metal layer by sputtering on bottom surfaces of the openings and then forming the second metal layer by sputtering on the first metal layer, side walls of the openings and the dielectric layer.

21. The method of claim 12, further comprising forming at least a conductive through hole in the encapsulant, wherein the conductive through hole is electrically connected to the circuit structure.

22. The method of claim 21, further comprising disposing a substrate on the encapsulant, wherein the substrate is electrically connected to the conductive through hole.

23. The method of claim 12, further comprising forming a plurality of conductive elements on the metal structure.

24. The method of claim 12, further comprising disposing a substrate on the encapsulant with a release layer formed between the substrate and the encapsulant after forming the encapsulant on the first side of the circuit structure, wherein the release layer is in direct contact with the encapsulant.

* * * * *